United States Patent [19]
Sirna et al.

[11] Patent Number: 6,100,759
[45] Date of Patent: Aug. 8, 2000

[54] LOW NOISE, INTEGRATED AC DIFFERENTIAL AMPLIFIER

[75] Inventors: Guglielmo Sirna, Aci Castello; Giuseppe Palmisano, Catania, both of Italy

[73] Assignee: STMicroelectronics S.r.l., Agrate Brianza, Italy

[21] Appl. No.: 09/255,078

[22] Filed: Feb. 22, 1999

[30] Foreign Application Priority Data

Feb. 27, 1998 [IT] Italy ................................. VA98A0004

[51] Int. Cl.$^7$ ....................................................... H03F 3/45
[52] U.S. Cl. ............................................ 330/252; 330/261
[58] Field of Search ................................... 330/252, 261, 330/310

[56] References Cited

U.S. PATENT DOCUMENTS

| | | | |
|---|---|---|---|
| 5,057,788 | 10/1991 | Ushida et al. ........................... | 330/261 |
| 5,552,742 | 9/1996 | Perkins ..................................... | 330/252 |
| 5,610,547 | 3/1997 | Koyama et al. ......................... | 330/252 |

*Primary Examiner*—Robert Pascal
*Assistant Examiner*—Khanh Van Nguyen
*Attorney, Agent, or Firm*—Theodore E. Galanthay; Allen, Dyer, Doppelt, Milbrath & Gilchrist, P.A.

[57] ABSTRACT

A low noise integrated differential AC amplifier includes a cascode differential input stage comprising first and second branches. The first branch includes a first input transistor and the second branch includes a second input transistor. Each transistor has a collector and an emitter, and the emitters being connected together to define a common emitter node. The amplifier also includes two output stages connected to respective outputs of the first and second branches. Each output stage may include a common collector transistor stage including a bias current generator and a feedback circuit. A first biasing circuit forces a first biasing current through the first input transistor by injecting the first biasing current on the collector thereof. A second biasing circuit forces a second biasing current through the first input transistor by injecting the second biasing current on the collector thereof. A resistance is connected between the common emitter node of the first and second input transistors and a common supply node of the circuit. The low noise amplifier may be used in a radio frequency receiver.

25 Claims, 2 Drawing Sheets

LOW NOISE, INTEGRATED AC DIFFERENTIAL AMPLIFIER

FIELD OF THE INVENTION

The present invention relates to analog amplifiers, and, more particularly, to RF amplifiers for integrated supereterodyne receivers powered with relatively low voltage batteries.

BACKGROUND OF THE INVENTION

Many fully integrated receivers of digital and/or analog radio broadcast signals use low noise amplifiers (LNA) in the input stage for enhancing sensitivity of the receiver. Often the LNA represents the interface between the receiver, integrated on silicon, and the external circuitry (antenna, filters, etc.) operating at radio frequency (RF). Normally, in RF applications the common functional blocks have an input and/or output impedance of 50 Ω.

In consideration that in silicon integrated systems the signal path lengths are negligible compared to the wavelength, only the input stage must have an input impedance of 50 Ω because the output of the LNA is directly fed to the co-integrated mixer. In integrated high frequency amplifiers, high gain and low noise characteristics are difficult to achieve with acceptable return losses. This imposes the need for an external impedance matching network which increases the complexity and cost of the whole receiver.

A rather common application is that of a superetherodyne receiver and the ensuing description will at times refer to this important application. A typical superetherodyne receive chain is shown by way of the block diagram of FIG. 1. This type of receiver is currently used in most mobile radio apparatuses.

The RF signal sensed by the antenna is mixed with a certain frequency, generated by a local oscillator (LO). Commonly, the signal coming from the antenna passes through a preselector filter to reduce the out-of-band noise. The low noise amplifier (LNA) increases the power level of the RF signal to an amplitude suitable to convert the signal to an intermediate frequency. The mixer stage mixes the RF antenna signal with the signal generated by the local oscillator LO, outputting an intermediate frequency signal (IF).

In a well-designed receiver, the noise performance is largely dependent on the characteristics of the first amplifying stage, as well as on the losses that occur upstream of the LNA. This means that the LNA must have a high gain and low noise properties. In addition, any filter and/or network present upstream of the LNA input must cause the lowest possible insertion losses.

The noise introduced by the LNA amplifier depends primarily on the geometry of the active devices, on the quiescent current and on the input impedance. Therefore, when designing low noise integrated AC amplifiers, great attention must be devoted to the input stage.

The noise figure (NF) requirement, normally fixed by the system specifications, dictates the area of the input transistors and their collector current (Ic). Low noise amplifiers usually show a poor return loss from their input stage. To improve this intrinsic characteristic of an integrated LNA, use is made of external impedance matching circuits which, in turn, may cause insertion losses, according to the scheme shown in FIG. 1.

Another typical drawback of fully integrated receivers comes from the fact that analog circuit blocks (amplifiers) that are relatively close to the local oscillator, commonly a voltage controlled oscillator (VCO), and thereby to digital circuit blocks functioning in the baseband frequency, are subject to an injection of switching noise. This comes from logic circuits switching at relatively high levels through the common substrate and supply rails. This type of noise seriously compromises the noise performance of the analog blocks of the receiver. To overcome this situation a differential configuration is mandatory for those blocks that are most seriously affected by switching noise.

Moreover, prevailing market requirements are for fully integrated receivers provided by circuit blocks capable of functioning at particularly low supply voltages (<2.5V) for battery powered portable devices. The relatively low supply voltage restricts the dynamic range and renders the biasing conditions of an LNA more critical. As a result, it becomes even more difficult to satisfy both the high gain and low noise specifications using traditional circuit configurations for these types of low noise amplifiers.

There are many known circuits for implementing a low noise amplifier. In fully integrated low noise amplifiers for RF applications it is common to use resistive loads rather than inductive loads. Inductive loads are strongly dependent upon the frequency of operation and accurate Q figures to achieve a high gain. A resistive load allows for a more accurate control of the gain.

The basic circuit of a typical fully differential LNA is depicted in FIG. 2, wherein the equivalent intrinsic noise voltage and the current source value are also indicated. The circuit has a cascoded structure to ensure an enhanced frequency response. It is easy to notice that the main parameters of the amplifier of FIG. 2, such as the noise Figure, the input impedance and the gain are respectively given by:

$$NF_{dB} = 10 Log_{10} \left( 1 + \frac{r_b}{R_S} + \frac{1}{2 g_m R_S} + \frac{g_m R_S}{2\beta} \right) \quad (1)$$

$$Zin = \frac{2 \frac{\beta}{g_m}}{1 + j\omega \cdot \tau_F g_m} \quad (2)$$

$$Av = G_m R_c \quad (3)$$

Rs is the source resistance (typically 50 Ω), $g_m$ is the transconductance of the transistors of the input pair, Q1 and Q2, $r_b$ is the base resistance of the same transistors Q1 and Q2 (typically of about 8 Ω), $\tau_F$ is the transit time of Q1 and Q2 (typically around 6 picoseconds), and Av is the voltage gain (typically about 20 dB).

For example, by solving equation (1) for a typical value of Ic=2 mA, we obtain:

NF=1.2 dB

Rc=130 Ω

Zin=650 $e^{-j70}$ Ω

These Figures show that the noise figure has an excellent value although it is attained at the expense of a relatively high input mismatch. Indeed, by directly driving the amplifier, without using an impedance matching network, the return loss, L, at 1 GHz may be easily computed to be about 0.5 dB, which is a definitively poor value.

To increase the return loss figure, an external matching network must be used. The external matching network, in turn, increases the noise figure as well as the complexity and the cost of the system.

Moreover, the above discussed known configuration is also affected by the DC drop on the load resistances Rc. This limits the ability of the amplifier to function at a reduced supply voltage. Indeed, the direct current crossing the input pair of transistors Q1 and Q2, which must be relatively high to ensure a sufficient low noise value, also flows through Rc, causing a consequently large voltage drop.

SUMMARY OF THE INVENTION

Confronted with these limits and drawbacks of the known circuits, the present invention provides a fully differential low noise amplifier (LNA), wherein feedback is exploited for obtaining an input impedance of a value near the source impedance (≈50 Ω), at least for its resistive part, to thereby avoid the need to use external impedance coupling networks. Practically, by the use of a simple balun at the LNA input, an adequately high return loss value is achieved.

According to a fundamental aspect of the circuit of the low noise differential amplifier of the invention, a bias current through the input pair of transistors is injected directly on the collector of the respective input transistor without crossing the cascading transistor or the load.

The common emitter node of the transistors of the input pair is preferably coupled to the supply rail through a resistor, rather than more conventionally through a current generator. Accordingly, the amplifier may function even at a particularly low supply voltages, for example, with a supply voltage lower than 2V. The bias current injected directly on the collector of the input transistor, downstream of the cascading transistor and of the load, may be fixed by a resistor or by a current generator.

Each of the two output nodes of the differential cascoded input stage, drive a respective output stage provided by a common collector output transistor stage. Between the output node (emitter node of the output transistor) and the respective input node of the amplifier is connected a feedback path provided by a resistor and capacitor in series.

BRIEF DESCRIPTION OF THE DRAWINGS

The different aspects and advantages of the circuit of the invention will become even clearer through the following description and analysis of a preferred embodiment and by referring to the annexed drawings, wherein.

DETAILED DESCRIPTION OF THE PREFERRED EMBODIMENTS

Figure 3:
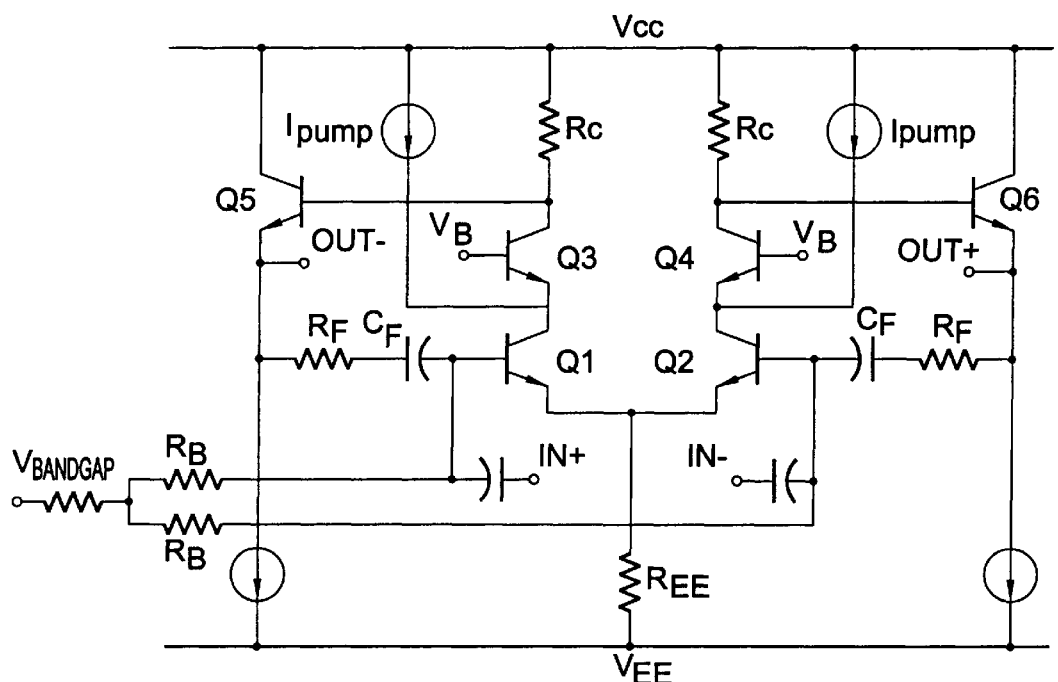
FIG. 3 is a circuit diagram of a low noise fully differential integrated circuit, according to the present invention.

With reference to the diagram of FIG. 3, the integrated LNA of the invention is based on a cascoded differential stage structure including the transistors Q1, Q2, Q3 and Q4, for the respective resistive loads $R_c$, and the respective output stages provided by the transistors Q5 and Q6 in a common collector configuration. The two feedback paths or lines, each comprising the resistor $R_f$ and the capacitor $C_f$, implement a shunt—shunt AC feedback configuration.

The gain of the amplifier is incremented without any accompanying reduction of the output swing by using two distinct circuits $I_{pump}$ for imposing a certain bias current and such to cause a bias current through the transistors Q1 and Q2 of the input pair higher than the current that flows in the respective load resistor $R_c$. The two distinct current generators, $I_{pump}$, may be and are preferably substituted by two simple resistors $R_p$ illustrated in dashed lines of identical values and such to determine a certain bias current through Q1 and Q2.

More generally, the quiescent current in the two branches of the differential amplifier is fixed by using a bandgap reference voltage $V_{BANDGAP}$. The band-gap voltage is applied to the bases of Q1–Q2, thus providing for PTAT bias currents through the resistor $R_{EE}$ connected between the common emitter node of the two input transistors Q1 and Q2 and the virtual ground node $V_{EE}$ of the circuit. The use of the resistor $R_{EE}$ and of distinct current injection elements $I_{pump}$ makes the amplifier capable of functioning at supply voltages that may drop as low as 2V and even lower.

Notwithstanding the fact that a considerable voltage drop on Rc is so prevented, high values of $g_m$ and Av are achieved. Moreover, by using a resistance $R_{EE}$ instead of a conventional current generator between the common emitter node of the input pair transistors Q1 and Q2 and ground, the common mode noise is reduced. The common mode noise, in part, transforms itself into differential noise because of mismatches in the differential pair of transistors operating at high frequency.

It may be easily demonstrated that, with a good approximation, the differential input resistance of the amplifier is given by:

$$R_i \approx \frac{R_F}{g_{m1,2} R_C} \quad (4)$$

where $g_{m1,2}$ is the transconductance of the emitter-coupled pair of input transistors Q1 and Q2.

To ensure a good input impedance matching, Ri is set equal to the differential source resistance $R_s$. Since the current in Q1 and Q2 is a PTAT current, and in consideration that the resistors are of polysilicon, $R_i$ has an accuracy of about 15% and a temperature coefficient of approximately 0.07%/° C. In view of modern technologies, this may be considered the best result for an integrated embodiment of the amplifier circuit of the invention.

The closed-loop voltage gain Av is given by:

$$A_v = g_{m1,2} R_c \quad (5)$$

By virtue of the PTAT bias current in Q1 and Q2, the gain Av is determined by the bandgap voltage ($V_{BG}$) and by the ratio between the value of the polysilicon resistors and the emitter areas. This allows for high accuracy and temperature stability.

By neglecting few minor high frequency contributions, the noise factor is approximately equal to:

$$F = 1 + \frac{r_{bl,2}}{R_S} + \frac{R_S}{R_F} + \frac{1}{2}\left(\frac{1}{g_{m1,2} R_S} + \frac{g_{m1,2} R_S}{\beta_F}\right) \quad (6)$$

For instance, biasing the amplifier with a collector current $I_{c1,2}=2$ mA and setting the value of Rc such to provide a closed-loop voltage gain Av=20 dB, we obtain:

NF=2.2 dB

Rc=130 W

Zin=50 $e^{-j4}$ W

L(@1 GHz)=10 dB

Figure 1:
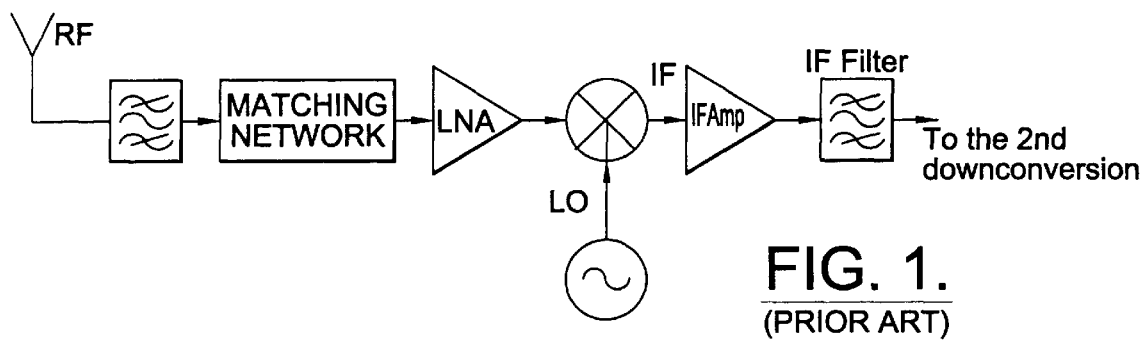
FIG. 1 shows the block diagram of a superetherodyne receiver, as mentioned above as in the prior art.
Figure 2:
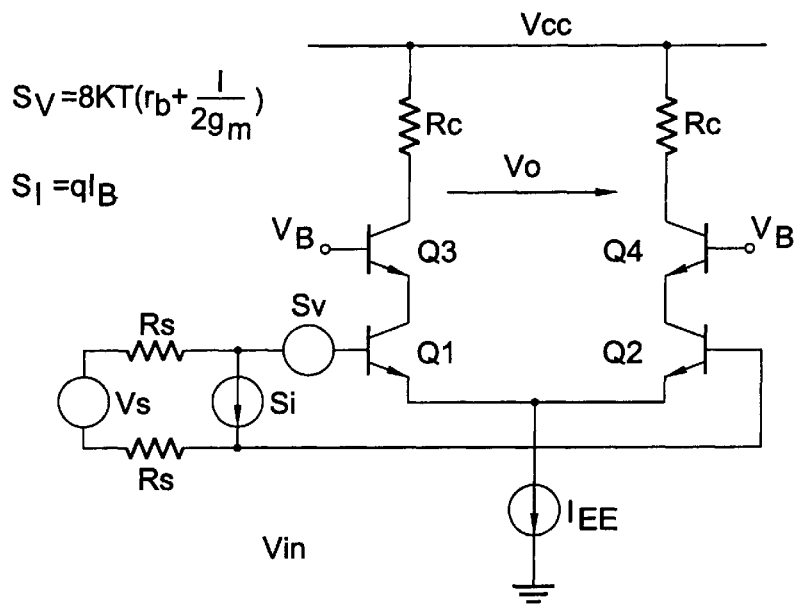
FIG. 2 shows a typical circuit of a low noise fully differential amplifier, as described above as in the prior art.

Therefore, an appropriate value of return loss (L) is achieved without using external impedance matching networks satisfying the main objective of the invention. The noise value is slightly higher than that of the known circuit of FIG. 1, but remains perfectly suitable for most RF applications.

What is claimed is:

1. A low noise integrated differential AC amplifier comprising:
   a cascode differential input stage comprising first and second branches, the first branch comprising a first input transistor and the second branch comprising a second input transistor, each input transistor having a collector and an emitter, the emitters being connected together to define a common emitter node;
   two output stages connected to respective outputs of the first and second branches, each output stage comprising a common collector transistor stage including a bias current generator and a feedback circuit;
   a first biasing circuit forcing a first biasing current through the first input transistor by injecting the first biasing current on the collector thereof;
   a second biasing circuit forcing a second biasing current through the first input transistor by injecting the second biasing current on the collector thereof; and
   a resistance connected between the common emitter node of the first and second input transistors and a common supply node of the circuit.

2. An amplifier according to claim 1, wherein said first and second biasing circuits comprise respective first and second current generators.

3. An amplifier according to claim 1, wherein said first and second biasing circuits comprise respective first and second integrated resistances.

4. An amplifier according to claim 1, wherein each feedback circuit comprises a resistor and a capacitor electrically connected in series.

5. An amplifier according to claim 1, wherein said first and second input transistors each have a respective base; and wherein a quiescent current through each of the two branches is established by applying a bandgap voltage to the bases of the first and second input transistors establishing PTAT bias currents on said resistance connected between the common emitter node and the common supply node of the circuit.

6. An amplifier according to claim 1, wherein said cascode input stage further comprises a third input transistor connected to said first input transistor, and a fourth input transistor connected to said second input transistor.

7. An amplifier according to claim 6, further comprising a first resistor connected in series with said first and third input transistors, and a second resistor connected in series with said second and fourth input transistors.

8. A low noise amplifier comprising:
   a cascode differential input stage comprising first and second branches, the first branch comprising a first input transistor and the second branch comprising a second input transistor, input each transistor having a collector and an emitter, the emitters being connected together to define a common emitter node;
   two output stages connected to respective outputs of the first and second branches, each output stage comprising a common collector transistor stage and a feedback circuit connected to a respective branch of said differential input stage;
   a first resistor forcing a first biasing current through the first input transistor by injecting the first biasing current on the collector thereof;
   a second resistor forcing a second biasing current through the first input transistor by injecting the second biasing current on the collector thereof; and
   a third resistor connected between the common emitter node of the first and second input transistors and a common supply node of the circuit.

9. An amplifier according to claim 8, wherein each feedback circuit comprises a resistor and a capacitor electrically connected in series.

10. An amplifier according to claim 8, wherein said first and second input transistors each have a respective base; and wherein a quiescent current through each of the two branches is established by applying a bandgap voltage to the bases of the first and second input transistors establishing PTAT bias currents on said resistance connected between the common emitter node and the common supply node of the circuit.

11. An amplifier according to claim 8, wherein said cascode input stage further comprises a third input transistor connected to said first input transistor, and a fourth input transistor connected to said second input transistor.

12. An amplifier according to claim 11, further comprising a fourth resistor connected in series with said first and third input transistors, and a fifth resistor connected in series with said second and fourth input transistors.

13. An amplifier according to claim 8, further comprising a first bias current generator biasing the first output stage, and a second bias current generator biasing the second output stage.

14. A radio frequency (RF) receiver comprising:
   a filter, a low noise amplifier connected to said filter, and at least one downconverting stage connected to the low noise amplifier, said low noise amplifier comprising
   a cascode differential input stage comprising first and second branches, the first branch comprising a first input transistor and the second branch comprising a second input transistor, each input transistor having a collector and an emitter, the emitters being connected together to define a common emitter node,
   two output stages connected to respective outputs of the first and second branches, each output stage comprising a common collector transistor stage including a bias current generator and a feedback circuit,
   a first biasing circuit forcing a first biasing current through the first input transistor by injecting the first biasing current on the collector thereof,
   a second biasing circuit forcing a second biasing current through the first input transistor by injecting the second biasing current on the collector thereof, and
   a resistance connected between the common emitter node of the first and second input transistors and a common supply node of the circuit.

15. An RF receiver according to claim 14, wherein said first and second biasing circuits comprise respective first and second current generators.

16. An RF receiver according to claim 14, wherein said first and second biasing circuits comprise respective first and second integrated resistances.

17. An RF receiver according to claim 14, wherein each feedback circuit comprises a resistor and a capacitor electrically connected in series.

18. An RF receiver according to claim 14, wherein said first and second input transistors each have a respective base; and wherein a quiescent current through each of the two branches is established by applying a bandgap voltage to the bases of the first and second input transistors establishing PTAT bias currents on said resistance connected between the common emitter node and the common supply node of the circuit.

19. An RF receiver according to claim 14, wherein said cascode input stage further comprises a third input transistor connected to said first input transistor, and a fourth input transistor connected to said second input transistor.

20. An RF receiver according to claim 19, further comprising a first resistor connected in series with said first and third input transistors, and a second resistor connected in series with said second and fourth input transistors.

21. A method for low noise amplification using an amplifier comprising a cascode differential input stage including first and second branches, an first and second output stages connected thereto, the first branch comprising a first input transistor and the second branch comprising a second input transistor, each transistor having a collector and an emitter, the emitters being connected together to define a common emitter node, the method comprising the steps of:

providing feedback between the two output stages and respective branches of the cascode differential input stage;

forcing a first biasing current through the first input transistor by injecting the first biasing current on the collector thereof;

forcing a second biasing current through the first input transistor by injecting the second biasing current on the collector thereof; and providing a resistance connected between the common emitter node of the first and second input transistors and a common supply node of the circuit.

22. A method according to claim 21, wherein the step of forcing the first biasing current comprises forcing the first biasing current using a first current generator; and wherein the step of forcing the second biasing current comprises forcing the second biasing current using a second current generator.

23. A method according to claim 21, wherein the step of forcing the first biasing current comprises forcing the first biasing current using a first integrated resistor; and wherein the step of forcing the second biasing current comprises forcing the second biasing current using a second integrated resistor.

24. A method according to claim 21, wherein the step of providing feedback comprises providing a respective resistor and capacitor electrically connected in series between the output stage and branch of the as code differential input stage.

25. A method according to claim 21, further comprising the step of setting a quiescent current through each of the two branches by applying a bandgap voltage to the bases of the first and second input transistors establishing PTAT bias currents on said resistance connected between the common emitter node and the common supply node of the circuit.

* * * * *